(12) United States Patent
Chen et al.

(10) Patent No.: US 7,800,226 B2
(45) Date of Patent: Sep. 21, 2010

(54) INTEGRATED CIRCUIT WITH METAL SILICIDE REGIONS

(75) Inventors: Yuanning Chen, Plano, TX (US); Maxwell Walthour Lippitt, III, Rockwall, TX (US); William M. Moller, Austin, TX (US)

(73) Assignee: Agere Systems Inc., Allentown, PA (US)

( * ) Notice: Subject to any disclaimer, the term of this patent is extended or adjusted under 35 U.S.C. 154(b) by 421 days.

(21) Appl. No.: 11/821,396

(22) Filed: Jun. 22, 2007

(65) Prior Publication Data

US 2007/0252220 A1    Nov. 1, 2007

Related U.S. Application Data

(62) Division of application No. 10/245,447, filed on Sep. 17, 2002, now Pat. No. 7,250,356.

(51) Int. Cl.
*H01L 29/76* (2006.01)

(52) U.S. Cl. .................. 257/754; 257/755; 257/757; 257/377; 257/382; 257/384

(58) Field of Classification Search .................. 257/377, 257/382, 384, 754, 755, 757
See application file for complete search history.

(56) References Cited

U.S. PATENT DOCUMENTS

| 5,047,367 | A |   | 9/1991  | Wei et al. |
| 5,136,362 | A |   | 8/1992  | Grief et al. |
| 5,376,342 | A |   | 12/1994 | Waite |
| 5,766,997 | A | * | 6/1998  | Takeuchi ............ 438/257 |
| 5,902,129 | A | * | 5/1999  | Yoshikawa et al. ...... 438/592 |
| 5,970,370 | A |   | 10/1999 | Besser et al. |
| 6,025,634 | A | * | 2/2000  | Teong ............ 257/383 |
| 6,121,139 | A |   | 9/2000  | Chang et al. |
| 6,146,983 | A | * | 11/2000 | Gardner et al. ........ 438/586 |
| 6,281,102 | B1 | * | 8/2001  | Cao et al. ............ 438/592 |
| 6,383,906 | B1 |   | 5/2002  | Wieczorek et al. |
| 6,551,927 | B1 |   | 4/2003  | Chen et al. |
| 6,586,321 | B2 |   | 7/2003  | Tai |
| 6,844,601 | B2 | * | 1/2005  | Trivedi et al. ........ 257/383 |

* cited by examiner

*Primary Examiner*—Eugene Lee

(57) ABSTRACT

A method for forming a metal silicide region in a silicon region of a semiconductor substrate. The method comprises forming a metal layer over the silicon region, then in succession forming a titanium and a titanium nitride layer thereover. As the substrate is heated to form the silicide, the titanium getters silicon dioxide on the surface of the silicon region and the titanium nitride promotes the formation of a smooth surface at the interface between the silicide layer and the underlying silicon region.

3 Claims, 5 Drawing Sheets

INTEGRATED CIRCUIT WITH METAL SILICIDE REGIONS

CROSS-REFERENCE TO RELATED APPLICATIONS

This application is a divisional of U.S. application Ser. No. 10/245,447, filed on Sep. 17, 2002, the disclosure of which is incorporated herein by reference.

FIELD OF THE INVENTION

The present invention relates to the field of semiconductor devices and device manufacturing, and more particularly, to the formation of low leakage self-aligned silicide ("salicide") regions.

BACKGROUND OF THE INVENTION

After forming the individual device regions in a semiconductor substrate, the regions must be connected together to form an operative device that performs the desired circuit functions. This connection process is referred to as metallization and is performed using a number of different photolithographic and deposition techniques. The overall effectiveness of the metal interconnect system is governed by the resistivity, thickness, length and the total contact resistance of all the metal-region interconnects. The contact resistance at a metal-to-region interface is influenced by the materials employed, the substrate doping and the contact dimensions. The smaller the contact size, the higher the contact resistance. In modern semiconductor circuits the contact region is the dominant factor in the metal interconnect system performance.

One technique for forming a low contact resistance device employs a silicide layer on the device doped regions, such as the source/drain regions and polysilicon gate of a metal-oxide-semiconductor field effect transistor (MOSFET). This practice has become increasingly important for very high density devices where the feature size, and thus the contact area, is reduced to a fraction of a micrometer. Silicide provides good ohmic contact, reduces the sheet resistivity and the contact resistance of source/drain regions and polysilicon gates, increases the effective contact area, and provides an etch stop layer during subsequent processing steps.

A common technique employed in semiconductor manufacturing to form the silicide contact is self-aligned silicide ("salicide") processing. Salicide processing involves the deposition of a metal that forms intermetallic bonds with the silicon (Si), but does not react with silicon oxide or silicon nitride. Common metals employed in salicide processing are titanium (Ti), cobalt (Co), tungsten (W), molybdenum (Mo) and nickel (Ni). Generally, refractory metals are used to form the silicide. These metals form low resistivity phases with silicon, such as $TiSi_2$, $CoSi_2$ and $NiSi$.

To form the silicide, the metal is deposited with a uniform thickness across the entire semiconductor wafer, by for example, using a physical vapor deposition (PVD) from an ultra-pure sputtering target and a commercially available ultra-high vacuum (UHV), multi-chamber, direct current magnetron sputtering system. The deposition is performed after gate etch and source/drain junction formation. The deposited metal blankets the polysilicon gate electrode, the oxide spacers between the gate and the source/drain regions, and the oxide isolation regions between devices. A cross-section of an exemplary semiconductor wafer during one stage of a salicide formation process in accordance with the prior art techniques is depicted in FIG. 1.

As shown in FIG. 1, a n-type MOSFET 8 is formed within a silicon substrate 10, comprising a p-type well 11, lightly doped (n−) source/drain regions 12/14, source/drain regions (n+) 16/18, and a polysilicon gate 20 formed over a gate oxide 22. Oxide spacers 24 are formed on the sides of the polysilicon (n+ type) gate electrode 20. A refractory metal layer 30, comprising cobalt, for example, is blanket deposited over the source/drain regions 16/18, the polysilicon gate 20 and the spacers 24. The metal layer 30 also blankets silicon dioxide isolation regions 32 that isolate adjacent devices.

A first rapid thermal anneal (RTA) is then performed at a temperature of between about 450° to 700° C. for a short period in a nitrogen atmosphere. The nitrogen reacts with the metal to form a metal nitride at the top surface 33 of the metal 30, while the metal reacts with the underlying silicon, forming a metal silicide. Hence, the reaction of the metal with the silicon forms a silicide region 40 within the gate 20 and silicide regions 41 within the source/drain regions 16/18, as depicted in FIG. 2. Typically, about one-third of the underlying silicon is consumed during the formation of the metal silicide.

After the first rapid thermal anneal step, any unreacted metal is stripped away by a wet etch process that is selective to the metal silicide. The resultant structure is illustrated in FIG. 3. The substrate 10 is subjected to a second, higher temperature rapid thermal anneal step, for example above 700° C., to change the stochiometry of the metal silicide, forming a lower resistance metal silicide by converting the higher resistivity metal silicide to a lower resistivity phase. For example, when the metal is cobalt, the higher resistivity phase is $Co_2Si$ and the lower resistivity phase is $CoSi_2$.

As described above, when the polysilicon and doped source/drain regions are both exposed to the metal, the silicide forms simultaneously over both regions. Thus, this method is described as a "salicide" process since the silicides formed over the polysilicon and single-crystal silicon are self-aligned to each other.

One of the concerns associated with cobalt silicide technologies is junction leakage, which occurs when cobalt silicide is formed such that it extends nearly to the bottom of the source/drain region 16/18. The distance between the cobalt silicide layer 41 and the bottom of the source/drain region 16/18 is identified by a reference character 50 in FIG. 3. A cause of this problem is high silicon consumption during the silicide formation process. One solution for overcoming this problem is to make the doped source/drain regions 16/18 deeper. However, this is counter to the preferred extremely shallow source and drain regions that support device scaling. Also, the deeper device regions negatively impact device performance.

Leakage also occurs due to incomplete removal of the unreacted metal from the spacers 24 and the oxide isolation regions 32. As a result, gate-to-substrate and region-to-region leakage currents flow through the unreacted metal. Also, prolonged anneal cycles, used to ensure reaction between the metal and the underlying silicon, can result in the formation of metal silicide ribbons on the surface of the silicon dioxide regions 32, again creating a path for the flow of leakage currents.

It is known that the sheet resistance of the silicide layer 40/41 is an inverse function of the layer thickness. It is also known that the degree of roughness at the interface between the silicide layer 40/41 and the underlying silicon device region, such as the source/drain regions 16/18, influences current leakage. To achieve a preferred sheet resistance, a thicker silicide layer may be required. However, if the silicide layer 41 is made too thick, the distance 50 decreases, thereby increasing the likelihood of leakage current flow between the source/drain regions 16/18 and the p-type well 11. Further, increased roughness of the interface also increases leakage current. It is therefore advantageous to form a silicide layer with reduced surface roughness.

According to the prior art, a capping layer, for example a titanium layer, is formed over the cobalt layer before the first RTA step, to reduce the aforementioned surface roughness.

BRIEF SUMMARY OF THE INVENTION

According to the teachings of the present invention, both a titanium and a titanium nitride layer are formed over the metal layer before the substrate is processed through a RTA step.

A metal layer, such as cobalt, is deposited over the substrate surface, including over the gate and source/drain junctions. A titanium layer is formed over the metal layer and a titanium nitride layer is formed over the titanium layer. During the subsequent anneal step, the titanium nitride layer reduces the roughness of the silicide-silicon region interface. The titanium layer provides a gettering action for oxide that may be on the surface of the silicon region to reduce the formation of impurities in the silicide layer.

BRIEF DESCRIPTION OF THE DRAWINGS

The present invention can be more easily understood and the further advantages and uses thereof more readily apparent, when considered in view of the following detailed description when read in conjunction with the following figures, wherein.

In accordance with common practice, the various described features are not drawn to scale, but are drawn to emphasize specific features relevant to the invention. Reference characters denote like elements throughout the figures and text.

DETAILED DESCRIPTION OF THE INVENTION

According to the teachings of the present invention, a capping layer over the metal layer comprises a relatively thin layer of titanium (for example on the order of a few Angstroms thick) and a relatively thicker layer of titanium nitride. Both material capping layers are formed before the substrate 10 undergoes the first RTA process.

Figure 1:
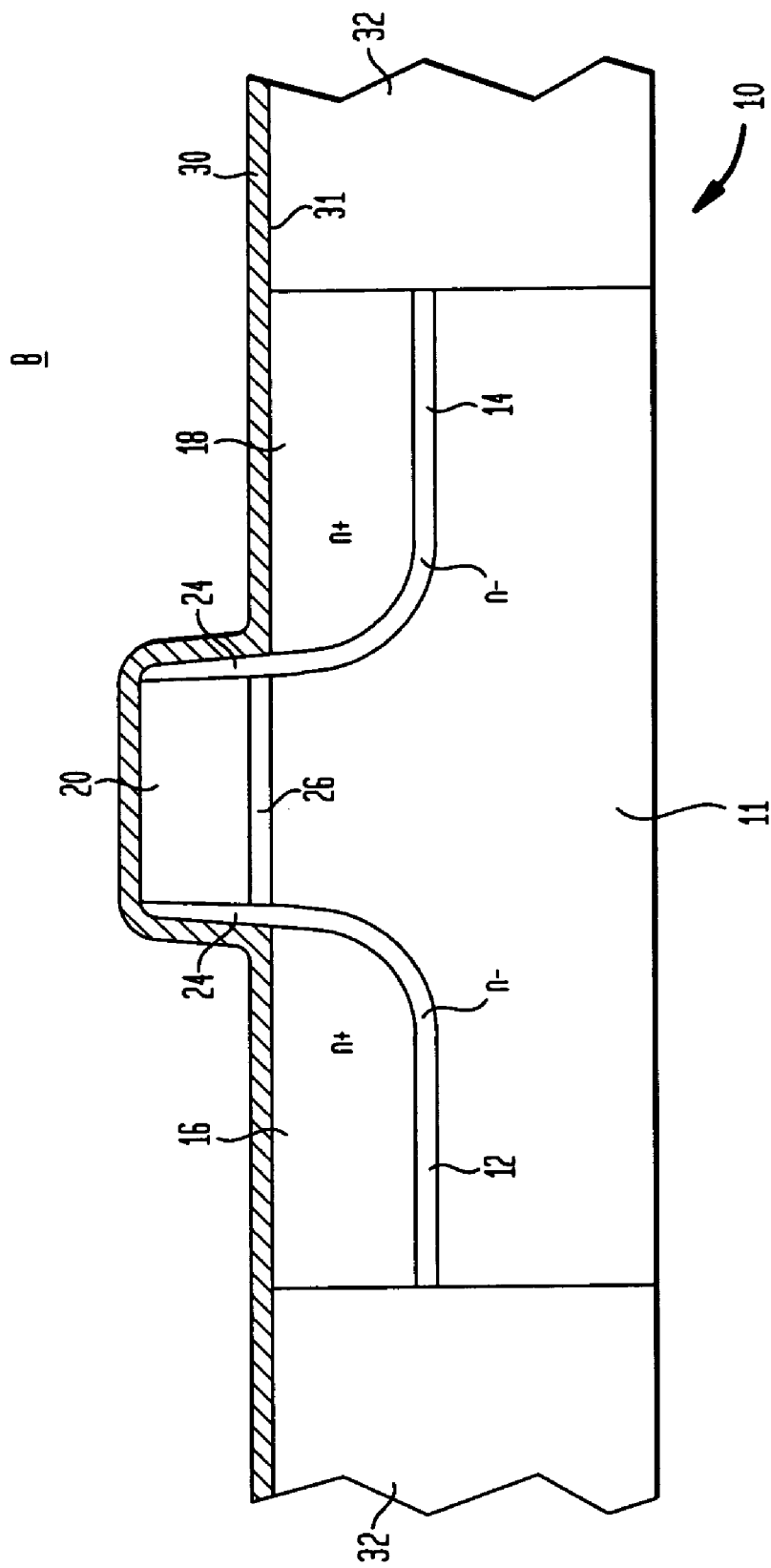
FIGS. 1, 2 and 3 are cross-sectional views of a semiconductor substrate during various prior art silicide processing steps.
Figure 2:
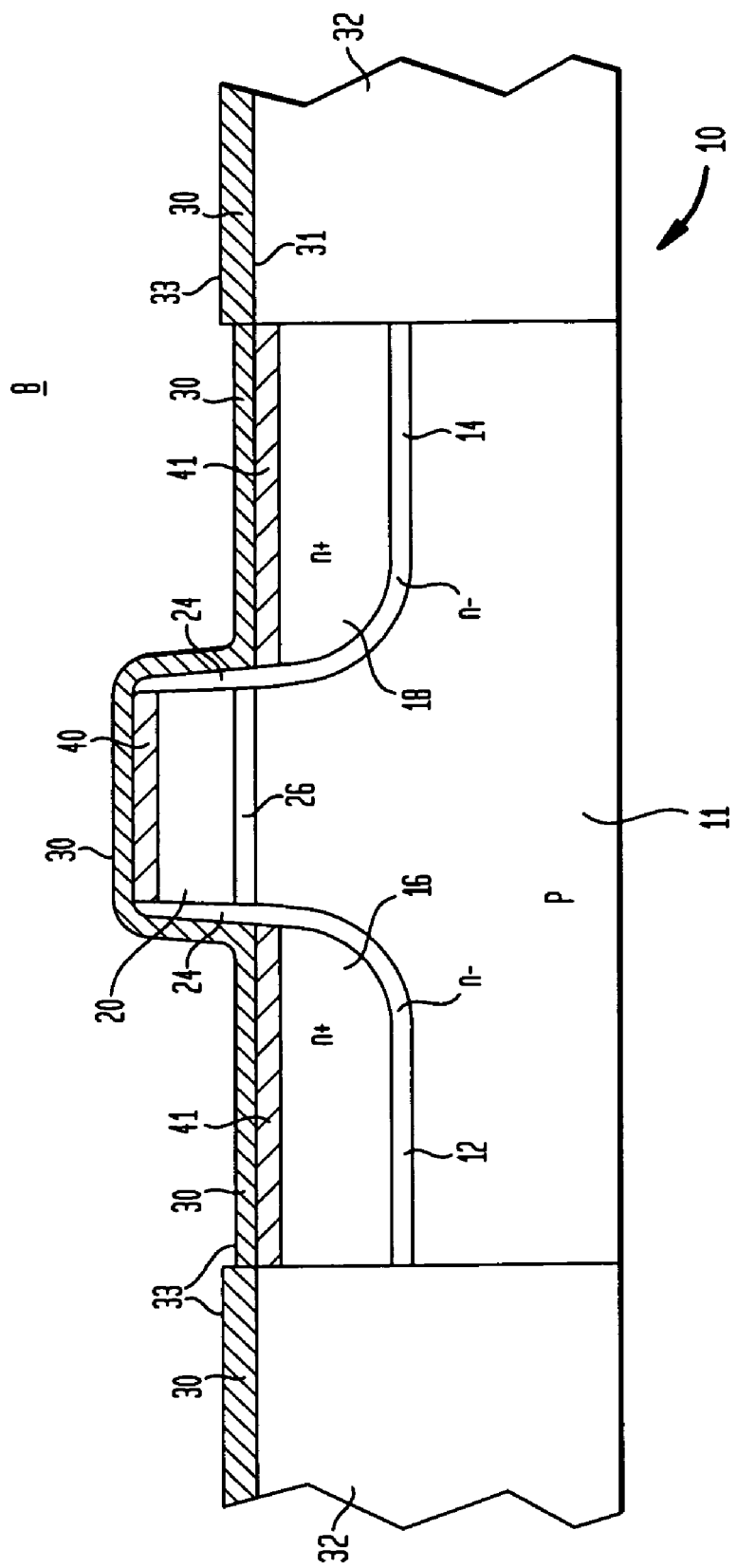
Figure 3:
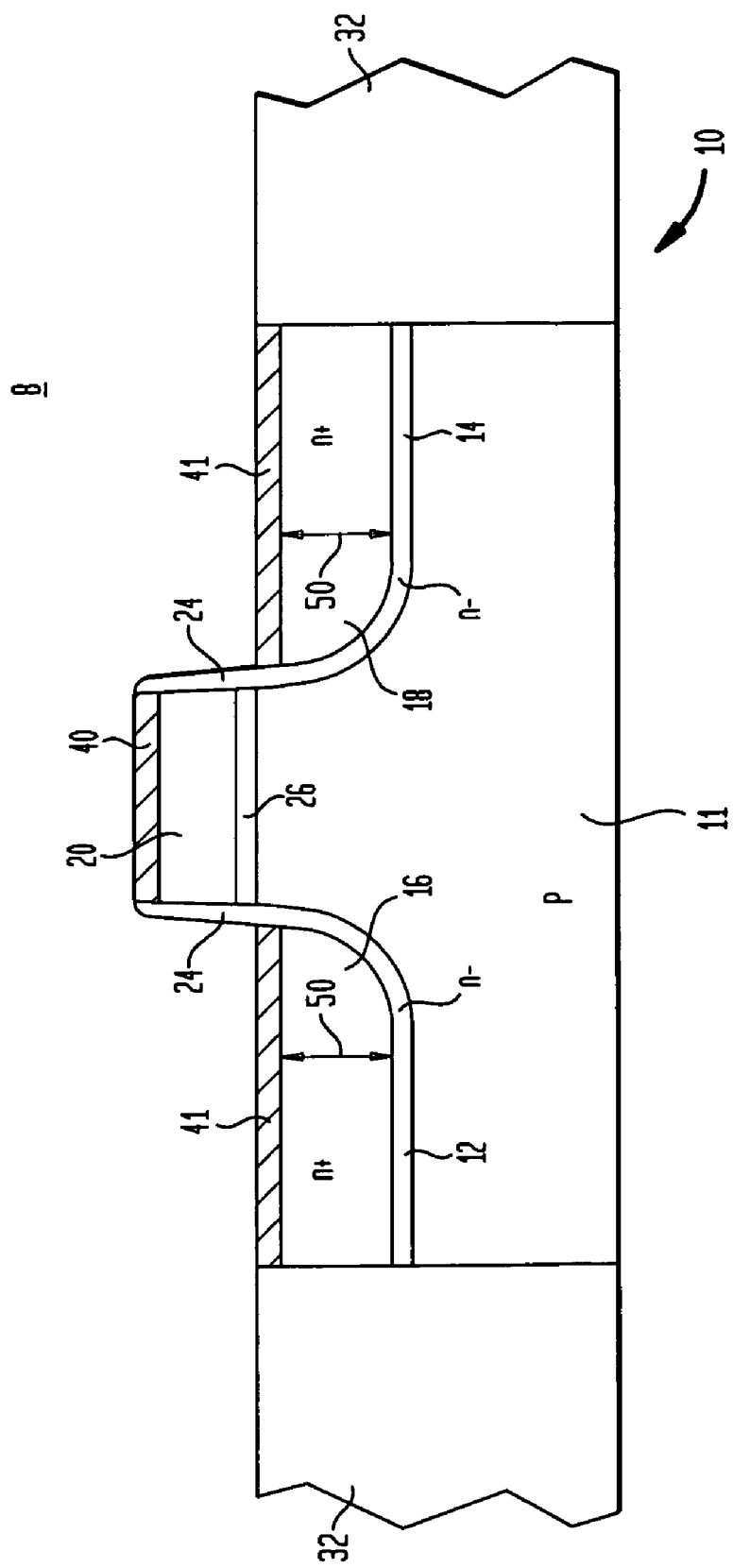
Figure 4:
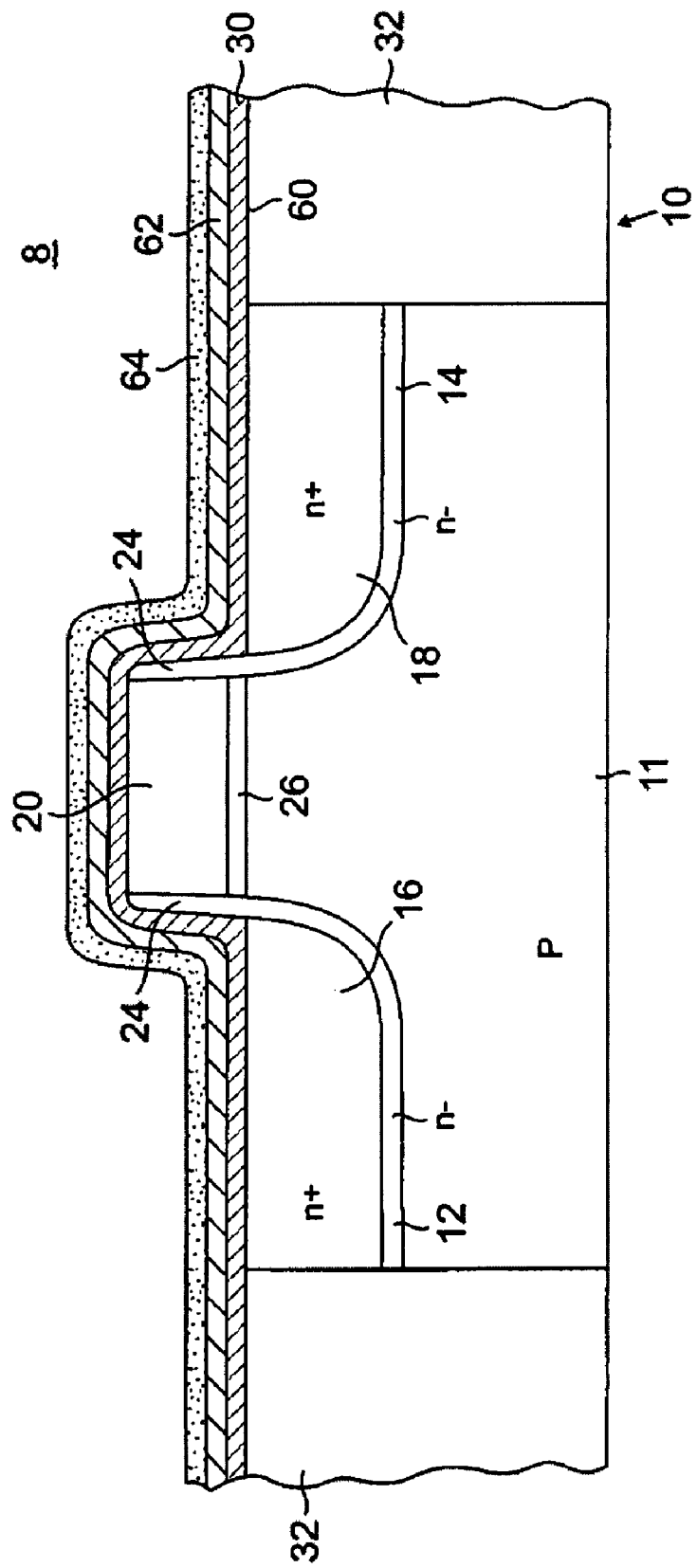
FIGS. 4 and 5 are cross-sectional views of a semiconductor substrate during various processing steps in accordance with certain embodiments of the present invention.

The metal layer 30 is first deposited with a substantially uniform thickness over an upper surface 60 of the substrate 10. See FIG. 4. Exemplary processes for forming the metal layer 30 include physical vapor deposition (PVD) from an ultra-pure metal sputtering target and a commercially available ultra-high vacuum (UHV), multi-chamber, direct current magnetron sputtering system. The deposition is performed after both the gate and the source/drain regions have been formed. The deposited metal blankets the polysilicon gate electrode 20, the oxide spacers 24, the source/drain regions 16/18, and the oxide isolation regions 32.

A titanium layer 62 (or a layer comprised of another gettering material) is formed over the metal layer 30. In one exemplary process, the substrate 10 enters a second chamber of the deposition tool, after which titanium is introduced to form the titanium layer 62. Advantageously, both the titanium and the metal material are typically available within the same deposition tool, thus the substrate 10 is not exposed to ambient air between the formation of the metal layer 30 and formation of the titanium layer 62. Finally, nitrogen is introduced into the chamber to form the titanium nitride layer 64.

The substrate is then subjected to a first RTA process, conventionally carried out in a nitrogen ambient vacuum. As the metal layer is forming a silicide in the underlying silicon, the titanium atoms, which are smaller than the metal atoms, diffuse through the metal layer to the surface of the silicon, where they getter silicon dioxide that may be present on the silicon surface.

It is known that higher quality silicide regions are formed when the silicon surface is pristine, i.e., having minimal amount of silicon dioxide formed thereon. Since silicon dioxide forms rapidly in a standard atmosphere at room temperature, during the various wafer processing steps the silicon surface can become contaminated with silicon dioxide. For example, prior to the metal deposition the substrate is cleaned. After the cleaning step, the substrate is transported to a deposition tool. During transportation the substrate is subjected to the ambient atmosphere. Since the vacuum has been "broken," conditions are favorable for the formation of silicon dioxide on the substrate surface. Most fabrication processes employ "close coupling" steps in the process to limit silicon dioxide formation, but close coupling requires an organized and efficient fabrication process and is not always achievable in an operational fabrication facility. Thus the use of gettering titanium is advantageous to remove the silicon dioxide from the silicon surface as the silicide is being formed. Formation of a relatively thin titanium layer also prevents the titanium from substantially competing with the metal for the silicon atoms, thus limiting the amount of titanium silicide that is formed. The delineation between the subsequently formed titanium silicide and underlying metal silicide is illustrated schematically as 76 in FIG. 5.

Figure 5:
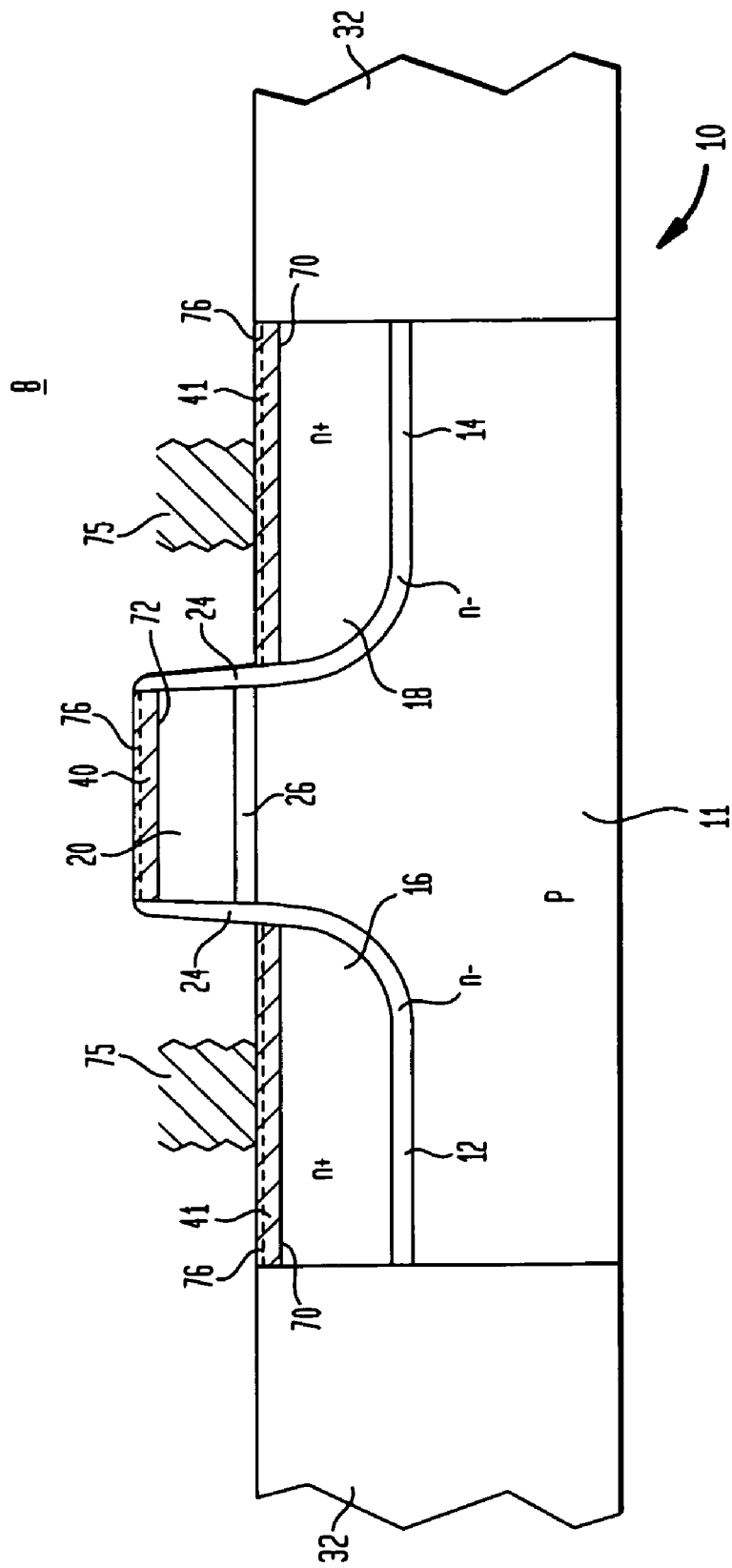

During the first RTA process, the titanium nitride 64 interacts with the metal silicide to produce a smoother surface at the interface between the metal silicide layer 41 and the source/drain regions 16/18, (referred to by reference character 70 in FIG. 5) and the silicide layer 40 and the gate electrode 20 (referred to by reference character 72 in FIG. 5). This is due, at least in part, to a more uniform grain boundary growth promoted by the titanium nitride at the interface between the metal silicide and the underlying silicon or polysilicon region.

The substrate is then subjected to a wet cleaning process to remove the titanium nitride layer 64, the titanium layer 62 and the unreacted metal overlying the silicon dioxide spacers 24 and the silicon dioxide isolation regions 32. The final form of the substrate, with interconnect 75 formed in contact with silicide layer 40 is illustrated in FIG. 5.

An architecture and process have been described as useful for forming a metal silicide layer in a semiconductor substrate. While specific applications and examples of the invention have been illustrated and discussed, the principals disclosed herein provide a basis for practicing the invention in a variety of ways and in a variety of circuit structures. Numerous variations are possible within the scope of the invention. The invention is limited only by the claims that follow.

What is claimed is:

1. An integrated circuit comprising:
   a substrate;
   a cobalt silicide region consisting of a cobalt silicide layer adjacent the substrate; and a titanium silicide layer formed from a titanium layer, the titanium silicide layer overlying the cobalt silicide wherein the titanium layer provides a silicon dioxide gettering material, and wherein the titanium silicide layer is thinner than the cobalt silicide layer.

2. The integrated circuit of claim 1 further comprising a conductive interconnect in contact with the cobalt silicide.

3. The integrated circuit of claim 1 wherein the substrate comprises a first device region selected from the group consisting of a source region selected from the group consisting of a source region and a drain region of a field effect transistor and the cobalt silicide layer is formed on the first device region.

* * * * *